United States Patent [19]
Nishitani

[11] Patent Number: 5,792,698
[45] Date of Patent: Aug. 11, 1998

[54] METHOD OF MANUFACTURING SEMICONDUCTOR LIGHT EMITTING DEVICE

[75] Inventor: Katsuhiko Nishitani, Kanagawa, Japan

[73] Assignee: Kabushiki Kaisha Toshiba, Kawasaki, Japan

[21] Appl. No.: 701,404

[22] Filed: Aug. 22, 1996

Related U.S. Application Data

[63] Continuation of Ser. No. 354,111, Dec. 6, 1994, abandoned.

[30] Foreign Application Priority Data

Dec. 9, 1993 [JP] Japan .......................... 5-309238

[51] Int. Cl.$^6$ .................................. H01L 21/20
[52] U.S. Cl. ................. 438/287; 438/289; 117/89; 117/93; 117/102
[58] Field of Search .................. 117/89, 93, 102; 438/287, 289

[56] References Cited

U.S. PATENT DOCUMENTS

| | | | |
|---|---|---|---|
| 5,003,548 | 3/1991 | Bour et al. | 372/44 |
| 5,105,432 | 4/1992 | Murakami et al. | 372/46 |
| 5,189,680 | 2/1993 | Kimura | 372/46 |
| 5,192,711 | 3/1993 | Murakami et al. | 437/129 |
| 5,204,869 | 4/1993 | Valster et al. | 372/45 |
| 5,223,043 | 6/1993 | Olsen et al. | 136/249 |
| 5,305,341 | 4/1994 | Nishikawa et al. | 372/45 |
| 5,336,635 | 8/1994 | Anayama et al. | 437/129 |

*Primary Examiner*—Robert Kunemund
*Attorney, Agent, or Firm*—Finnegan, Henderson, Farabow, Garrett & Dunner, L.L.P.

[57] ABSTRACT

A method of manufacturing a semiconductor light emitting device employs an MOCVD process. The method sequentially forms, on a GaAs substrate, at least an InGaAlP clad layer, an active layer, an InGaAlP clad layer, a GaAlAs or InGaAlP current diffusion layer, and a GaAlAs or InGaAlP light scattering layer. The flow-rate ratio (V/III ratio) of a V-group source gas to a III-group source gas for forming the light scattering layer is smaller than that for forming the current diffusion layer. As a result, the surface of the light scattering layer is roughened to improve light emission efficiency.

10 Claims, 2 Drawing Sheets

METHOD OF MANUFACTURING SEMICONDUCTOR LIGHT EMITTING DEVICE

This application is a continuation of Ser. No. 08/354,111, filed Dec. 6, 1994, now abandoned.

BACKGROUND OF THE INVENTION

1. Field of the Invention

The present invention relates to a semiconductor light emitting device such as a light emitting diode (LED) made from InGaAlP-based compound semiconductor, and particularly, to a method of manufacturing a semiconductor light emitting device having a high-intensity structure.

2. Description of the Prior Art

Display panels usually employ light emitting devices made from GaP-based III–V compound semiconductor. Recently, a high-intensity light emitting device made from InGaAlP-based compound semiconductor has been developed. This device emits light of 550 to 690 nm in wavelength according to direct transition. The direct transition improves light emission efficiency. When electrons at the bottom of a conduction band recombine with holes at the top of a valence band, light emanates. When emitting light, direct band-gap semiconductor involves no change in momentum, and therefore, promotes recombination of electrons, to achieve higher light emission efficiency than indirect band-gap semiconductor. The light emitting devices employing the direct band-gap semiconductor, therefore, are applicable to outdoor display panels, road panels, stop lamps of cars, etc., to which the light emitting devices employing the indirect band-gap semiconductor are inapplicable because they are too dim.

FIG. 1 is a sectional view showing a conventional multilayer semiconductor light emitting device made from InGaAlP-based compound semiconductor. There are many epitaxy processes to form this kind of device. Among them, a liquid phase epitaxial growth process, a molecular beam epitaxy (MBE) process, and a metal organic chemical vapor deposition (MOCVD) process are well-known. The MOCVD process is generally achieved as a low-pressure MOCVD (LP-MOCVD) process that employs a V-group source gas including arsine ($AsH_3$) and phosphine ($PH_3$), a III-group source gas including trimethylindium (TMI), trimethylgallium (TMG), and trimethylaluminum (TMA), and a doping source gas including silane ($SiH_4$) and dimethylzinc (DMZn), to grow crystals under a constant low pressure.

The LP-MOCVD method will be explained with reference to FIG. 1. An n-GaAs substrate 101 is placed in a growth chamber, which maintains a constant low pressure and a constant temperature. The V-group, III-group, and doping source gases of adjusted quantities for respective deposition layers are fed into the growth chamber, to sequentially form, on the substrate 101, an n-GaAs buffer layer 102, an n-InAlP/GaAs light reflection layer 103, an n-InGaAlP clad layer 104, an undoped InGaAlP active layer 105, a p-InGaAlP clad layer 106, and a p-GaAlAs current diffusion layer 107. These substrate and layers form a multilayer epitaxial wafer. The wafer is taken out of the growth chamber. Au-based metal is deposited on each side of the wafer according to, for example, a vacuum vapor deposition process. A metal electrode 108 is formed on the current diffusion layer 107, and a metal electrode 109 is formed on the substrate 101, each according to a photolithography process. The wafer is diced into chips each forming the light emitting device of FIG. 1.

The current diffusion layer 107 has a mirror surface. The mirror surface totally reflects light emitted from the active layer 105 and light reflected by the reflection layer 103, if the light exceeds a critical angle. This device, therefore, is incapable of emitting sufficient light. To solve this problem, other conventional light emitting devices of FIGS. 2 and 3 have been proposed. The device of FIG. 2 has a p-InGaAlP light scattering layer 107A on a p-GaAlAs current diffusion layer 107. The layer 107A has large lattice mismatch with respect to the substrate 101, to form irregularities on the surface of the layer 107A to improve light emission efficiency. The lattice mismatach, however, easily develops misfit dislocations, or defects in the surface layer. Under an energized state, the dislocations (defects) propagate and finally reach to deteriorate an active layer 105, thereby lowering light output, degrading performance, and shortening service life. The device of FIG. 3 employs an $H_3PO_4$-based etching liquid to roughen the surface of a p-GaAlAs current diffusion layer 107. It is difficult, however, to accurately control the etching process because epitaxial layers are thin. This prior art, therefore, requires precision technology and involves low yield and low productivity.

SUMMARY OF THE INVENTION

To solve these problems, an object of the present invention is to provide a method of manufacturing a semiconductor light emitting device that develops no dislocation defects to deteriorate performance or shorten service life. The method easily forms irregularities on a light emission surface of the device to improve light emission efficiency without precision technology.

In order to accomplish the object, the present invention provides a method of manufacturing a III-V compound semiconductor light emitting device. The method employs an MOCVD process to sequentially form, on a GaAs substrate, at least an InGaAlP clad layer, an InGaAlP active layer, an InGaAlP clad layer, a GaAlAs or InGaAlP current diffusion layer, and a GaAlAs or InGaAlP light scattering layer. The flow-rate ratio, i.e., the V/III ratio of a V-group source gas to a III-group source gas for growing the light scattering layer is low to roughen the surface of the light scattering layer.

The V/III ratio for forming the light scattering layer is 20 or below, preferably 20 to 10, when the current diffusion layer is made from GaAlAs. When the current diffusion layer is made from InGaAlP, the v/III ratio for forming the light scattering layer is 150 or below, preferably, 100 to 150.

This light emitting device never develops and propagates dislocation defects to deteriorate performance. The surface of the light scattering layer is easily roughened without precision technology, to improve light emission efficiency.

Other and further objects and features of this invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

The embodiment of the present invention will be described with reference to the accompanying drawing.

Figure 4:
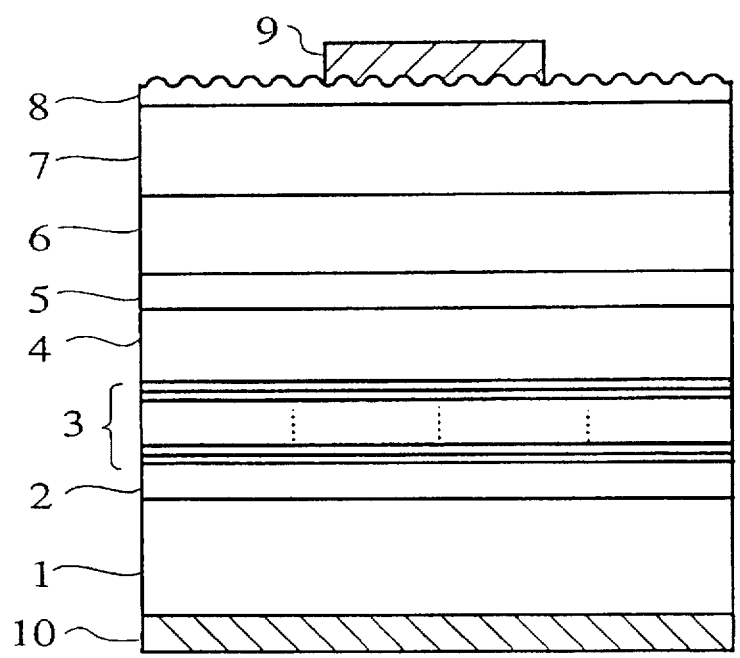
FIG. 4 is a sectional view showing a semiconductor light emitting device according to an embodiment of the present invention.

FIG. 4 is a sectional view showing a semiconductor light emitting device manufactured according to the present invention. The device consists of an n-GaAs substrate 1 on which an n-GaAs buffer layer 2, an n-InAlP/GaAs light reflection layer 3, an n-InGaAlP clad layer 4, an undoped InGaAlP active layer 5, a p-InGaAlP clad layer 6, a p-GaAlAs current diffusion layer 7, and a p-GaAlAs light scattering layer 8 characteristic to the present invention are sequentially deposited. A metal electrode 9 is formed at the center on the top face of the light scattering layer 8, and a metal electrode 10 is formed over the bottom face of the substrate 1. The active layer 5 radiates light of λ in wavelength. The light reflection layer 3 has a multilayer structure consisting of n-InAlP and n-GaAs layers that are alternately laid one upon another. The thickness of each of these layers is ¼n of the wavelength λ, where n is the refractive index of the layer material. The aluminum mixture ratios of the n-InGaAlP clad layer 4, p-InGaAlP clad layer 6, p-GaAlAs current diffusion layer 7, and p-GaAlAs light scattering layer 8 are determined to sufficiently transmit the light from the active layer 5.

The method of the present invention of manufacturing the semiconductor light emitting device of FIG. 4 will be explained. The method carries out an MOCVD process to grow semiconductor layers. The method uses a III-group source gas including trimethylgallium (TMG), trimethylaluminum (TMA), and trimethylindium (TMI), a V-group source gas including arsine ($AsH_3$) and phosphine ($PH_3$), an n-type doping source gas including silane ($SiH_4$), and a p-type doping source gas including dimethylzinc (DMZn). An n-GaAs substrate 1 is placed in a reaction chamber or growth chamber and is maintained at a fixed temperature. The source gases at a predetermined ratio and a hydrogen ($H_2$) carrier gas are fed into the reaction chamber. The source gases chemically react to sequentially deposit crystal layers on the substrate 1.

More precisely, the layers are deposited according to an LP-MOCVD process to keep a pressure in the reaction chamber at 4 to 13 kPa. A large amount of hydrogen carrier gas is continuously fed into the reaction chamber, and the n-GaAs substrate 1 is placed on a carbon or silicon susceptor in the chamber. The inside of the reaction chamber is kept at the low pressure, and the arsine gas is fed into the reaction chamber. The temperature of the substrate is increased to and maintained at 600 to 800 degrees centigrade. The substrate may be heated according to a resistance heating technique, an infrared lamp heating technique, or a high-frequency (RF) induction heating technique. If the resistance heating technique is employed, a quartz susceptor may be used. The source gases are mixed at proper V/III ratios for layers to grown and are fed into the low-pressure reaction chamber. Each V/III ratio of the source gases is determined to grow an epitaxial layer having a good mirror surface. For example, a V/III ratio of about 200 to 250 is set for a P (phosphorus) based III-V compound semiconductor layer such as an InGaAlP layer, and a V/III ratio of about 20 to 30 is set for an As based III-V compound semiconductor layer such as a GaAlAs layer. The clad layers 4 and 6, active layer 5, and current diffusion layer 7 are epitaxially grown with a mirror surface. When growing the light scattering top layer 8, the flow rate of the V-group source gas is decreased to lower the V/III ratio to 20 or below, preferably 10 to 20, more preferably 15 to 20, to roughen the surface of the layer 8. For this purpose, a mass flow controller is used. The current diffusion layer 7 is grown with the flow rate of the V-group source gas being increased to enlarge the V/III ratio, to cause no surface irregularities. On the other hand, the light scattering layer 8 is grown with the flow rate of the V-group source being decreased to lower the V/III ratio to 20 or below. As a result, the light scattering layer 8 has surface irregularities. It is possible to decrease the V/III ratio by increasing the flow rate of the III-group source gas.

In more detail, the embodiment of FIG. 4 carries out the LP-MOCVD process to form, on the n-GaAs substrate 1, the n-GaAs buffer layer 2 of 0.5 μm in thickness and $4 \times 10^{17} cm^{-3}$ in Si-doped carrier concentration, the n-$I_{0.5}Al_{0.5}$P/GaAs light reflection layer 3 of $4 \times 10^{17} cm^{-3}$ in Si-doped carrier concentration, the n-$I_{0.5}(Ga_{0.3}Al_{0.7})_{0.5}$P clad layer 4 of 0.6 μm in thickness and $3 \times 10^{17} cm^{-3}$ in Si-doped carrier concentration, the undoped $I_{0.5}(Ga_{0.85}Al_{0.15})_{0.5}$P active layer 5 of 0.3 μm in thickness, and the p-$I_{0.5}(Ga_{0.3}Al_{0.7})_{0.5}$P clad layer 6 of 0.6 μm in thickness and $3 \times 10^{7} cm^{-3}$ in Zn-doped carrier concentration. On the clad layer 6, the p-$Ga_{0.3}Al_{0.7}$As current diffusion layer 7 of 6 μm in thickness and $2 \times 10^{18} cm^{-3}$ in Zn-doped carrier concentration is grown. The current diffusion layer 7 is sufficiently transparent with respect to the wavelength of light from the active layer 5. On the current diffusion layer 7, the LP-MOCVD process grows the p-$Ga_{0.3}Al_{0.7}$As light scattering layer 8 of 1 μm in thickness and $2 \times 10^{8} cm^{-3}$ in Zn-doped carrier concentration with the flow rate of the V-group source gas, i.e., the arsine ($A_5H_3$) gas being reduced to decrease the V/III ratio to 20 or below. As a result, an epitaxial multilayer wafer having the structure of FIG. 4 with the light scattering top irregularities is formed.

Au-based metal is deposited on each side of the wafer according to a vacuum vapor deposition process or a sputtering process, and the wafer is patterned according to a photolithography process. More precisely, an Au—Be film of 0.7 μm in thickness having a predetermined pattern is formed at the center of the light scattering layer 8 and an Au film of 1 μm in thickness is formed thereon, to complete the metal electrode 9. An Au—Ge film of 0.5 to 1.0 μm in thickness having a predetermined pattern is formed as the metal electrode 10 on the substrate 1. Thereafter, the wafer is diced into chips each serving as the light emitting device of FIG. 4, by a diamond-blade dicing technique, a wire-saw dicing technique or combined technique therewith etc.

Figure 1:
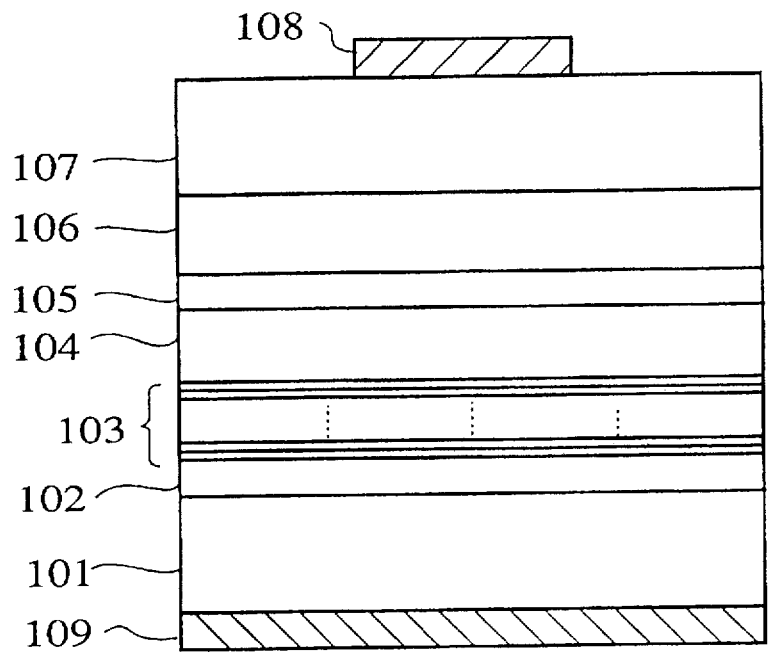
FIG. 1 is a sectional view showing a semiconductor light emitting device made from InGaAlP-based III–V compound semiconductor according to a prior art.
Figure 2:
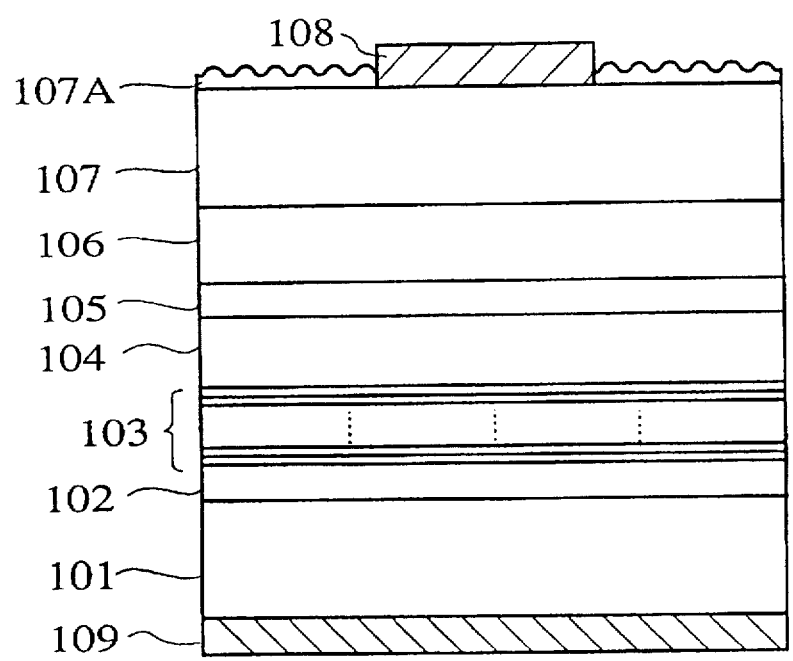
FIGS. 2 and 3 are sectional views showing semiconductor light emitting devices according to prior arts, respectively.
Figure 3:
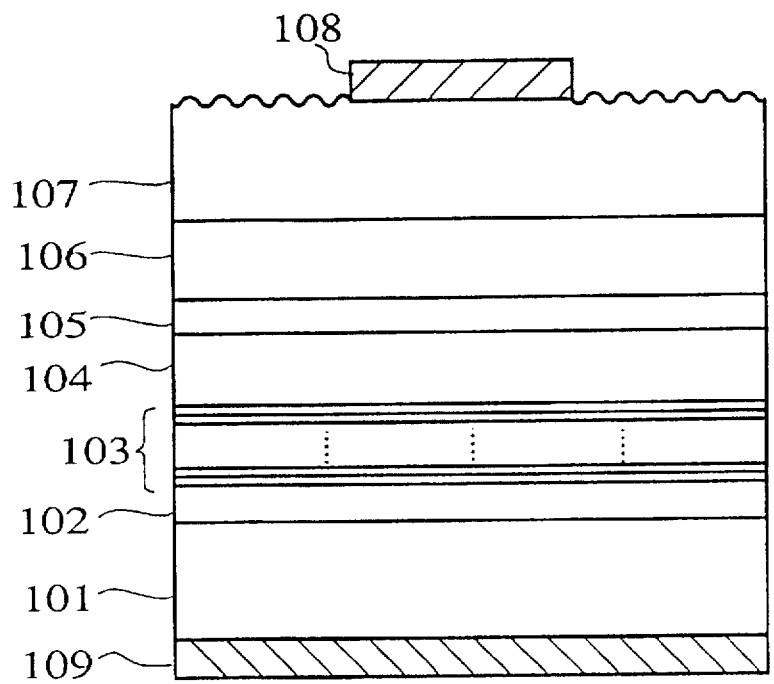

This device develops no dislocation defects, shows good performance, and has long service life. The device has the irregular light scattering layer, which is easy to form, to improve light emission efficiency. The intensity of light emitted by the device of the present invention is twice as strong as light emitted by the prior art of FIG. 2. The device of the present invention is easy to manufacture and ensures good yield and productivity.

In the above embodiment, the current diffusion layer 7 and light scattering layer 8 are made from GaAlAs, and therefore, the V/III ratio is set to 20 or below. If the current diffusion layer 7 and light scattering layer 8 are made from InGaAlP, the V/III ratio will be set to 150 or below, preferably, 100 to 150.

The V/III ratio for growing the light scattering layer 8 may be variable. For example, the V/III ratio is 18 at first to grow GaAlAs by 0.5 μm, then 15 to grow the same by 0.3 μm, and then 10 to grow the same by 0.2 μm, to thereby form the light scattering layer 8 of 1 μm thick. The V/III ratio may be 10 at first to grow GaAlAs by 0.2 μm and then 18 to grow the same by 0.8 μm, to thereby form the light scattering layer 8 of 1 μm thick.

Once irregularities are formed on a given surface, the irregularities will remain even if a smooth film of about 1 μm thick is formed thereon. Accordingly, the GaAlAs light scattering layer 8 may be firstly grown up to 0.5 μm with a V/III ratio of 15, and then up to 1.0 μm with a V/III ratio of 25. Although the V/III ratio of 25 forms no irregularities, the initially formed irregularities remain. When the top layer of a light emitting device is formed with a V/III ratio (for example, 25) that secures ordinary stoichiometric composition, the surface of the device is stabilized, and contact resistance with respect to a metal electrode formed on the surface is reduced.

Various modifications will become possible for those skilled in the art after receiving the teachings of the present disclosure without departing from the scope thereof. For example, instead of the LP-MOCVD process employing a growth pressure of 4 to 13 kPa, it is possible to employ a chemical beam epitaxy (CBE) process employing a growth pressure of $1 \times 10^{-3}$ Pa. It is also possible to employ a metal organic CVD (MOCVD) process employing an atmospheric pressure.

What is claimed is:

1. A method of manufacturing a semiconductor light emitting diode for emitting light from a top surface of epitaxially grown stacked layers, the method comprising the steps of metal-organic chemical vapor deposition (MOCVD) of:

(1) sequentially forming a light reflection layer on a GaAs substrate, an InGaAlP bottom clad layer on the light reflection layer, an active layer on the bottom clad layer, and an InGaAlP top clad layer on the active layer, the surface of each layer being essentially parallel with a top surface of the GaAs substrate respectively;

(2) forming a current diffusion layer from GaAlAs or InGaAlP on the top clad layer with a first V/III ratio; and (3) forming a light scattering layer having surface irregularities from GaAlAs or InGaAlP on the current diffusion layer with a second V/III ratio, the surface irregularities having an optical roughness sufficient to scatter the light, wherein the second V/III ratio is smaller than the first V/III ratio, and the value of second V/III ratio is small enough to generate the surface irregularities, and said steps (1), (2), and (3) are processed continuously without exposing the epitaxially grown stacked layer to the atmosphere during the continuous process.

2. A method of claim 1, wherein the light scattering layer is made from GaAlAs with the second V/III ratio being 20 or below.

3. A method of claim 2, wherein said second V/III ratio is 10 to 20.

4. A method of claim 3, wherein said second V/III ratio changes in the range between 10 to 20 during the formation of the light scattering layer.

5. A method of claim 1, wherein the light scattering layer is made from InGaAlP with the second V/III ratio being 150 or below.

6. A method of claim 5, wherein said second V/III ratio is 100 to 150.

7. A method of claim 6, wherein said second V/III ratio changes in the range between 100 to 150 during the formation of the light scattering layer.

8. A method of claim 1, wherein a GaAs buffer layer is formed on the GaAs substrate, and the light reflection layer is formed on the GaAs buffer layer.

9. A method of claim 1, further comprising a step of forming a metal electrode on a part of said light scattering layer.

10. A method of claim 1, wherein said light reflection layer is a quarter-wave stack mirror consisting of plural paired layers of InAlP and GaAs.

* * * * *

UNITED STATES PATENT AND TRADEMARK OFFICE
CERTIFICATE OF CORRECTION

PATENT NO. : 5,792,698
DATED : August 11, 1998
INVENTOR(S) : NISHITANI

It is certified that error appears in the above-indentified patent and that said Letters Patent is hereby corrected as shown below:

Claim 1, column 6, line 2, "V/Ill" should read --V/III--.

Claim 1, column 6, line 9, "V/IlI" should read --V/III--.

Signed and Sealed this

Twenty-second Day of June, 1999

*Attest:*

Q. TODD DICKINSON

*Attesting Officer*  Acting Commissioner of Patents and Trademarks